United States Patent
Printz et al.

(10) Patent No.: US 10,256,163 B2
(45) Date of Patent: Apr. 9, 2019

(54) METHOD OF TREATING A MICROELECTRONIC SUBSTRATE USING DILUTE TMAH

(71) Applicant: Tokyo Electron Limited, Tokyo (JP)

(72) Inventors: Wallace P. Printz, Austin, TX (US); Shuhei Takahashi, Koshi (JP); Naoyuki Okamura, Kumamoto (JP); Masami Yamashita, Koshi (JP); Derek W. Bassett, Cedar Park, TX (US); Antonio Luis Pacheco Rotondaro, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/350,637

(22) Filed: Nov. 14, 2016

(65) Prior Publication Data

US 2017/0141005 A1    May 18, 2017

Related U.S. Application Data

(60) Provisional application No. 62/348,745, filed on Jun. 10, 2016, provisional application No. 62/255,419, filed on Nov. 14, 2015.

(51) Int. Cl.
*H01L 21/306* (2006.01)
*H01L 21/3213* (2006.01)
(Continued)

(52) U.S. Cl.
CPC .............. *H01L 22/20* (2013.01); *C09K 13/00* (2013.01); *H01L 21/30604* (2013.01);
(Continued)

(58) Field of Classification Search
None
See application file for complete search history.

(56) References Cited

U.S. PATENT DOCUMENTS 8,043,436 B2   10/2011   Takimoto
8,113,221 B2    2/2012   Nanba et al.
(Continued)

OTHER PUBLICATIONS

European Patent Office, International Search Report and Written Opinion issued in counterpart Application No. PCT/US2016/061801 dated Feb. 15, 2017, 11 pp.
(Continued)

*Primary Examiner* — Duy T Nguyen
*Assistant Examiner* — Bo B Jang
(74) *Attorney, Agent, or Firm* — Wood Herron & Evans LLP

(57) ABSTRACT

Embodiments of the invention provide a method for treating a microelectronic substrate with dilute TMAH. In the method, a microelectronic substrate is received into a process chamber, the microelectronic substrate having a layer, feature or structure of silicon. A treatment solution is applied to the microelectronic substrate to etch the silicon, where the treatment solution includes a dilution solution and TMAH. A controlled oxygen content is provided in the treatment solution or in an environment in the process chamber to achieve a target etch selectivity of the silicon, or a target etch uniformity across the layer, feature or structure of silicon, or both by the treatment solution.

29 Claims, 5 Drawing Sheets

(51) Int. Cl.

| | | |
|---|---|---|
| *H01L 21/768* | (2006.01) | |
| *H01L 23/522* | (2006.01) | |
| *H01L 23/528* | (2006.01) | |
| *H01L 23/532* | (2006.01) | |
| *H01L 21/66* | (2006.01) | |
| *H01L 23/00* | (2006.01) | |
| *C09K 13/00* | (2006.01) | |
| *H01L 49/02* | (2006.01) | |

(52) U.S. Cl.
CPC .. *H01L 21/30608* (2013.01); *H01L 21/32134* (2013.01); *H01L 23/5226* (2013.01); *H01L 23/5283* (2013.01); *H01L 23/53228* (2013.01); *H01L 24/11* (2013.01); *H01L 24/13* (2013.01); *H01L 28/00* (2013.01); *H01L 21/76898* (2013.01)

(56) References Cited

U.S. PATENT DOCUMENTS

| | | | |
|---|---|---|---|
| 8,147,617 | B2 | 4/2012 | Sekiguchi et al. |
| 9,640,531 | B1 * | 5/2017 | Or-Bach ............. H01L 27/0688 |
| 2006/0042651 | A1 | 3/2006 | Verhaverbeke et al. |
| 2007/0178705 | A1 | 8/2007 | Shea |
| 2008/0178910 | A1 | 7/2008 | Hiroshiro et al. |
| 2009/0272407 | A1 | 11/2009 | Nakamura et al. |
| 2010/0108103 | A1 | 5/2010 | Minami et al. |
| 2010/0212701 | A1 | 8/2010 | Nanba et al. |
| 2010/0279494 | A1 | 11/2010 | Wang et al. |
| 2012/0006362 | A1 | 1/2012 | Yamamoto et al. |
| 2012/0111373 | A1 | 5/2012 | Arima et al. |
| 2013/0174873 | A1 | 7/2013 | Yoshihara et al. |
| 2013/0306238 | A1 | 11/2013 | Miura et al. |
| 2014/0080312 | A1 | 3/2014 | Iwamoto et al. |
| 2014/0291747 | A1 * | 10/2014 | Simsek-Ege ........ H01L 29/7889 257/316 |
| 2017/0294323 | A1 | 10/2017 | Miura et al. |

OTHER PUBLICATIONS

Tawain Intellectual Property Office, English translation of Notice of Examination Opinions issued in counterpart TW Application No. 105137007 dated Nov. 2, 2017, 7 pp.

Taiwan Patent Office, Office Action issued in corresponding Taiwan Patent Application No. 107125419 dated Dec. 7, 2018, 14 pages.

* cited by examiner

METHOD OF TREATING A MICROELECTRONIC SUBSTRATE USING DILUTE TMAH

RELATED APPLICATIONS

The present application claims the benefit of U.S. Provisional Patent Application No. 62/255,419 filed Nov. 14, 2015 and U.S. Provisional Patent Application No. 62/348,745 filed Jun. 10, 2016, each of which is incorporated herein by reference in its entirety.

FIELD OF THE INVENTION

This invention relates to semiconductor processing technology, and more particularly, to apparatus and methods for controlling chemical properties of gases and chemicals for treating a microelectronic substrate.

BACKGROUND OF THE INVENTION

One aspect of semiconductor processing is enabling selective removal of films that may be exposed to the same chemical environment because they are used to form features or structures that may be used to manufacture or form a microelectronic device. The selective removal, or selectivity, may be dependent on each films relative resistance to being etched or removed from the microelectronic substrate by a particular chemistry. Further, removing selected films in a relatively uniform manner may be useful when manufacturing a plurality of similar microelectronic devices across the surface of the microelectronic substrate. Accordingly, it would be desirable to develop new systems and methods that increase etch selectivity and etch uniformity of films or structures formed on the microelectronic substrate.

SUMMARY OF THE INVENTION

Embodiments of the invention provide a method for treating a microelectronic substrate, the method comprising receiving a microelectronic substrate into a process chamber, where the microelectronic substrate comprises a layer, feature or structure of silicon. A treatment solution is applied to the microelectronic substrate to etch the silicon, where the treatment solution comprises a dilution solution and TMAH. A controlled oxygen content is provided in the treatment solution or in an environment in the process chamber to achieve a target etch selectivity of the silicon, or a target etch uniformity across the layer, feature or structure of silicon, or both by the treatment solution.

In one embodiment, the method comprises applying a treatment solution to the microelectronic substrate to etch the silicon, the treatment solution comprising a mixture of a dilution solution and TMAH and having a first oxygen concentration of less than 1% by weight. Prior to or during applying the treatment solution, the method further includes exposing the treatment solution or an environment in the process chamber to a nitrogen-containing gas comprising a second oxygen concentration of less than 20% and a nitrogen concentration greater than the oxygen concentration, wherein the first and second oxygen concentrations are controlled to achieve a target etch selectivity of the silicon, or a target etch uniformity across the layer, feature or structure of silicon, or both by the treatment solution.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF THE INVENTION

Figure 1:
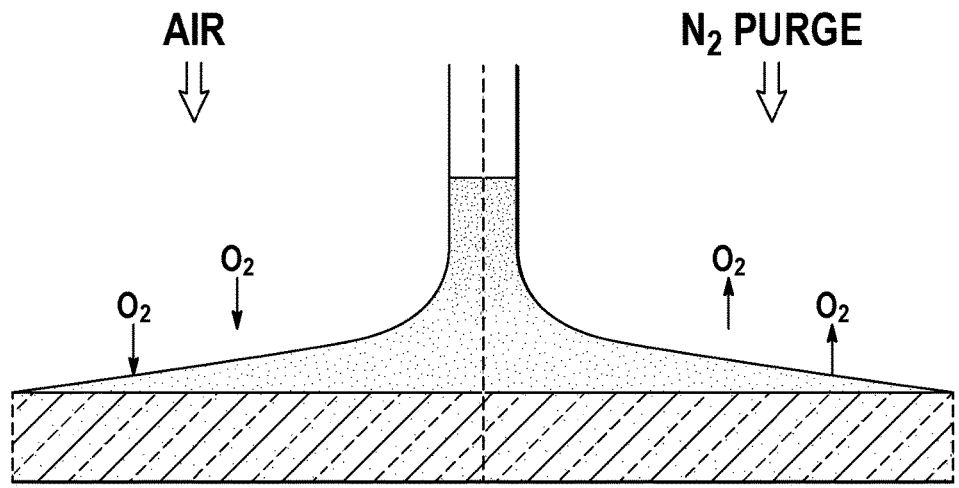
FIG. 1 is a schematic cross-section illustrating the dispensing of treatment solution onto a substrate and the effect of process chamber environment according to embodiments of the invention.

This disclosure relates to chemical processing methods for selective etching of different materials or films formed on microelectronic substrates that may be used to manufacture microelectronic devices. Disclosed herein are systems and methods for optimizing the chemistry and environmental conditions of a wet etching process that may be applied to, but is not limited to, 3DNAND, Logic, and TSV features that may be known to a person of ordinary skill in the art. These features may include, but are not limited to, trenches, film stacks, microbumps, or any feature used to manufacture a microelectronic device.

Microelectronic device manufacturing, as understood by a person of ordinary skill in the art, forms structures by patterning films that may have been deposited on the microelectronic substrate. Patterning may be implemented by selective removal of the films that may have similar properties to surrounding or adjoining films, which makes it difficult to remove the desired film while leaving the other film untouched or minimizing the impact to the other film. Ideally, etching processes may be optimized to increase the etch selectivity between surrounding or adjoining films, such that one film will be removed at a higher rate than another film(s) that is exposed to the same chemistry at the same time or may be exposed to the same chemistry when the film targeted for removal is removed and the other film is exposed. For example, one film may be a sacrificial film that may be used to form a microelectronic device, but may not be incorporated into the final configuration.

In one specific embodiment, silicon may be used to form features on the microelectronic substrate. The term "silicon" used herein may refer to either monocrystalline silicon or polysilicon, and may form part of the substrate as a layer, feature or structure. For example, silicon may refer to a silicon wafer, or may refer to a polysilicon layer, patterned with features or unpatterned. Specific reference to polysilicon is for example purposes only and is not intended to preclude applicability of any embodiment to other forms of silicon.

During the formation of features on the microelectronic substrate, polysilicon may grow an oxide, such as silicon dioxide, on its surface when its exposed to air or oxygen, which oxide may need to be removed prior to subsequent processing. In other embodiments, the oxide may be grown intentionally but may need to be removed prior to subsequent processing. In yet other embodiments, the substrate includes both polysilicon and surrounding or adjoining materials, which may include an oxide, and the polysilicon needs to be selectively etched without removing the surrounding or adjoining material. Unfortunately, etch selectivity between oxide and polysilicon may be relatively low for many chemistries. However, dilute tetramethylammonium hydroxide (TMAH) may be used to selectively remove the polysilicon without removing the oxide. Oxide growth on the polysilicon may inhibit that selectivity. Further, the process etch rate and/or etch profile from TMAH may be negatively impacted as device features decrease in size and/or density for next generation devices. Hence, existing processing techniques may be insufficient to selectively remove smaller amounts of polysilicon or in a uniform way across the substrate and/or across and/or along a substrate feature. New ways are disclosed herein to control the selective etch rate to a higher degree than in the past, by providing controlled oxygen content in the treatment solution or chamber environment. For example, new techniques may minimize the amount of oxygen that may be exposed to the substrate (e.g., to polysilicon), such as by controlling the oxygen concentration in the process chamber during the treatment and/or controlling the oxygen concentration in the dilute TMAH treatment solution, as indicated in the data disclosed herein.

In one embodiment, the microelectronic substrate to be treated may include a polysilicon film or a portion of a polysilicon film that may be deposited on the surface of the substrate. The polysilicon film may be patterned to include a hole or trench that extends into the polysilicon film. In other instances, the polysilicon film may be part of a patterned film stack, in which the polysilicon film is exposed so that it may be exposed to the treatment solution in the process chamber.

In another embodiment, the microelectronic substrate to be treated comprises a copper film or a portion of a copper film that may be exposed to the treatment solution in the process chamber. In one instance, the copper film may be a part of a Through-Silicon-Via (TSV) that may include a copper interconnect feature that may extend through the microelectronic substrate, e.g., through a silicon wafer. In another instance, the copper film may be part of a bonding structure that enables electrical communication between the device and the packaging that may be incorporated into the individual electrical devices. This may include a microbump structure or pattern that may include a copper film or layer.

In another embodiment, the microelectronic substrate to be treated may include logic or memory structures comprising polysilicon that may need to be selectively etched. For example, the memory devices may include 3DNAND structures or patterns that are known to persons of ordinary skill in the art.

According to embodiments of the method, the microelectronic substrate may be treated in a process chamber that may be configured to dispense a treatment solution. The process chamber may include a liquid dispensing system, which may be further configured to dispense a gas. For example, the process chamber may be coupled to a liquid dispensing system that may provide a treatment solution comprising a liquid etchant in a dilution solution for selectively etching the substrate. The treatment solution may be selected as needed to etch any type of surface on the microelectronic substrate. In one instance, the treatment solution may include a dilution solution and TMAH. The dilution solution may include water, deionized water, hydrogen peroxide, and/or ozone. For example, the dilution solution may include water or deionized water, and may optionally further include hydrogen peroxide or ozone. The ratio between the dilution solution and the TMAH may vary depending on the application. Several different applications may include, but are not limited to between 0.1% and 30% by weight of TMAH, 20% and 30% by weight of TMAH, and 0.1% and 5% by weight of TMAH. In one embodiment, the dilution solution comprises a concentration of less than 1% by weight of hydrogen peroxide or ozone. In another embodiment, the dilution solution comprises a concentration between 0.3% and 0.0001% by weight of hydrogen peroxide or ozone. In yet another embodiment, the dilution solution comprises a hydrogen peroxide concentration or ozone concentration between 1 part per billion and 10 parts per million.

A method for treating a substrate may include receiving a microelectronic substrate within the process chamber, and the process chamber may be enabled to control the pressure, temperature, and gas composition that may be exposed to the microelectronic substrate. The microelectronic substrate may be secured to a process chuck that may be able to rotate and/or translate the microelectronic substrate under a treatment solution dispensing nozzle or rotate the microelectronic substrate while translating the treatment solution dispensing nozzle either above or below the microelectronic substrate. By way of example, during the application of the treatment solution, the microelectronic substrate may be rotated to distribute the treatment solution across the surface. The rotation speed may be between 200 rpm to 1000 rpm. In other instances, the treatment solution distribution may also be controlled by moving the treatment solution dispense nozzle across the rotating or non-rotating microelectronic substrate. The dispense nozzle may be moved from side to side or may arc across the surface. In other instances, the dispense nozzle may be scanned across the surface while the treatment solution is being dispensed. The dispensing may be done on the either side of the microelectronic substrate.

In one embodiment, the process chamber may be configured to control the ambient or environmental conditions during the liquid dispense treatment, such that the air or gas exposed to the substrate's surface may be controlled to eliminate or control the amount of oxygen that may be exposed to the substrate (e.g., to polysilicon). For example, the process chamber may have a pressure control system that regulates the gas flow into the chamber, such that the ambient air may be prevented from entering the process chamber or such that oxygen concentration is controlled to minimize oxide growth on the polysilicon.

In another embodiment, the liquid dispensing system may include a carrier gas that carries the dilute TMAH to the process chamber. The oxygen concentration in the dilute TMAH may be controlled by minimizing the oxygen concentration in the carrier gas, within the source TMAH, or a combination of both. For example, a controlled oxygen content may be provided by using nitrogen as a carrier gas instead of compressed dry air (CDA) and/or minimizing ambient air exposure to the TMAH or the process chamber. The liquid dispensing system may include any liquid delivery system that may be implemented by a person of ordinary skill in the art and is not limited to a dispense system that uses a carrier gas.

In another embodiment, the treatment solution may include liquid TMAH that may be mixed with an oxygen-containing liquid prior to being dispensed onto the microelectronic substrate. For example, the oxygen-containing liquid may include, but is not limited to, hydrogen peroxide or ozone. In one embodiment, the oxygen-containing liquid comprises a concentration of less than 1% by weight of hydrogen peroxide or ozone. In another embodiment, the oxygen-containing liquid comprises a concentration between 0.3% and 0.0001% by weight of hydrogen peroxide or ozone. In yet another embodiment, the oxygen-containing liquid comprises a hydrogen peroxide concentration or ozone concentration between 1 part per billion and 10 parts per million. The TMAH/oxygen liquid treatment solution may incorporate the same or similar process conditions as described herein related to the TMAH liquid and oxygen gas embodiments.

The hardware embodiments disclosed herein may be enabled and/or implemented by the systems disclosed in the following U.S. patents or published applications that are incorporated by reference herein: U.S. Pat. No. 8,043,436, U.S. Pat. No. 8,113,221, U.S. Pat. No. 8,147,617, U.S. Pat. App. Pub. No. 20080178910, U.S. Pat. App. Pub. No. 20090272407, U.S. Pat. App. Pub. No. 20100108103, U.S. Pat. App. Pub. No. 20100212701, U.S. Pat. App. Pub. No. 20120006362, U.S. Pat. App. Pub. No. 20120111373, and U.S. Pat. App. Pub. No. 20130174873. Additionally, a person of ordinary skill in the art of chemical processing hardware may modify the disclosed hardware embodiments to implement the methods disclosed herein.

As stated above, controlling the ambient environment during the treatment is one technique that may be used to control or reduce the oxygen exposure to the microelectronic substrate to achieve a desired (or target) etch selectivity or uniformity. In one instance, the ambient environment may be used to control oxygen concentration using gas flow and pressure regulation to control the amount of oxygen introduced to the process chamber and/or to prevent outside air from entering the process chamber. Further, the oxygen concentration within the process chamber may be at a low enough level that oxygen within other gases or liquids that are used to treat the substrate may diffuse out away from the microelectronic substrate when exposed to the process chamber environment. For example, at least a portion of the oxygen within the dilute TMAH solution may diffuse out from the solution or at least away from the microelectronic substrate when the treatment solution is exposed to the microelectronic substrate. The lower amount of oxygen may increase the etching efficiency or selectivity of the dilute TMAH solution by preventing oxide growth or inhibiting the etch process of the polysilicon.

In one embodiment, after the microelectronic substrate is secured in the process chamber, the process may include exposing the microelectronic substrate to a gas comprising an oxygen concentration of less than 20%. However, in certain embodiments, the oxygen concentration in the gas will be less than 15% to achieve a desired etch rate or etch profile and in some instances the oxygen concentration may be less than 5% or between 5% and 10%. More broadly, the oxygen concentration may be between 1 part per billion and 10 parts per million. The process chamber may be configured to alternate between different oxygen concentration conditions as needed before applying the treatment solution.

Similarly, the oxygen concentration within the treatment solution may be controlled or minimized prior to being exposed to the microelectronic substrate. In this instance, by way of example, the oxygen concentration with the liquid source of the treatment solution (e.g., dilute TMAH) may be enabled by using a nitrogen-rich carrier gas or maintaining a liquid source pressure using a nitrogen-rich gas. This is in contrast to using air or CDA that may have a relatively higher oxygen concentration than the nitrogen-rich gas. For example, the treatment solution may be kept under pressure at a liquid source that provides the treatment solution to the process chamber. The liquid source may be pressurized using nitrogen gas, which is a low oxygen concentration gas. In one instance, the oxygen concentration in the treatment solution may be less than 20% by volume. In another instance, the treatment solution may include a mixture of a dilution solution and TMAH that includes an oxygen concentration of less than 10 ppm. In other specific embodiments, the oxygen concentration may be less than 5 ppm, less than 100 ppb, or less than 1500 ppb.

The oxygen concentration within the process chamber and/or in the treatment solution may be controlled or tuned to achieve a desired etch rate or etch profile across the microelectronic substrate and/or for features or patterned films stacks on the surface of the microelectronic substrate. The oxygen concentration may be tuned in conjunction with other process conditions disclosed herein to achieve desired etch rates and/or profiles. A person of ordinary skill in the art may tune the methods disclosure herein based, at least in part, on the film stack composition, thickness, geometry (e.g., step height, aspect ratio, etc.), or any combination thereof. For example, a person of ordinary skill in the art may treat a microelectronic substrate and measure a characteristic or feature to assess whether the uniformity or desired etch rate was achieved. In view of the measurement, a person of ordinary skill in the art may adjust the oxygen concentration within the process chamber and/or liquid dispensing system accordingly to achieve the desired etch rate or etch profile.

In one embodiment, the microelectronic substrate treatment method may control or tune the oxygen concentration in the treatment solution prior to being dispensed in the process chamber. For example, the microelectronic substrate may be secured within the process chamber and exposed to a gas that has a greater amount by weight of nitrogen than oxygen. In one specific embodiment, the gas comprises less than 20% by weight of oxygen. In another specific embodiment, the gas comprises an oxygen concentration less than 15%. In another specific embodiment, the gas comprises an oxygen concentration less than 10%. In other specific embodiments, the gas comprises an oxygen concentration less than 5% or between 5% and 10%.

Figure 2:
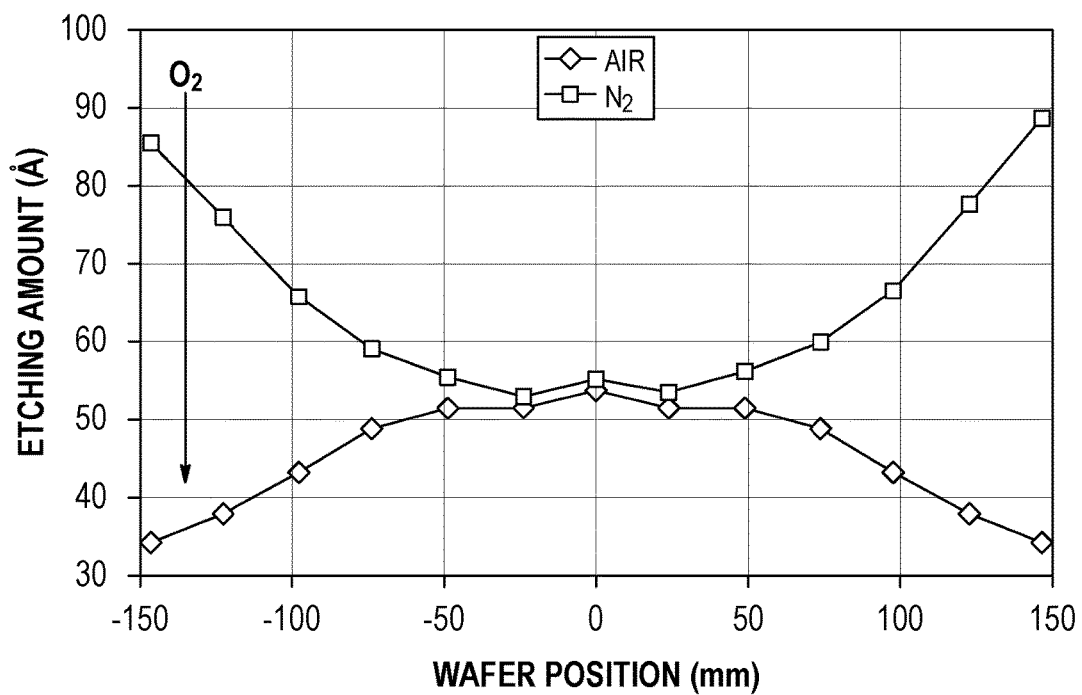
FIG. 2 is a graph illustrating the effect on etch profile of process chamber environment according to FIG. 1.

With reference to FIGS. 1 and 2, the affect of oxygen content is depicted. FIG. 1 shows, in schematic cross-section, dispensing of a treatment solution of 5% TMAH in a dilution solution of deionized water (DiW) onto a rotating silicon substrate. The TMAH will etch the silicon surface, but if oxide formation occurs on the surface, or a portion of the surface, the etch will be inhibited or slowed by the presence of the oxide. The treatment solution is dispensed along the center axis and spreads outwardly toward the edge of the substrate with a thinning outwardly profile. As shown on the left side of FIG. 1, if the environment in the process chamber comprises air, and the treatment solution has a small oxygen content from the deionized water, oxygen may be absorbed from the air into the treatment solution, particularly where the coverage is thinner near the substrate edge, causing a slower etch rate at the edge than at the center. The etch profile is shown in the graph of FIG. 2. On the other hand, as shown on the right side of FIG. 1, if the environment in the process chamber comprises nitrogen, and the treatment solution has a small oxygen content from the deionized water, oxygen may degas from the treatment solution into the nitrogen, particularly where the coverage is thinner near the substrate edge, causing a faster etch rate at the edge than at the center. The etch profile is thus opposite the etch profile in the case of air, as shown in the graph of FIG. 2. Consequently, the etch selectivity and/or uniformity can be controlled across a silicon layer, feature of pattern by controlling the relative content of oxygen and nitrogen in the treatment solution and the chamber environment. For example, the substrate may be exposed to a gas during exposure to the treatment solution, where the gas has an oxygen content less than 20% and a greater amount by weight of nitrogen than oxygen. By way of further example, the oxygen concentration may be less than 15%, or less than 5%, or between 5% and 10%. By way of further example, the oxygen concentration may be between 1 part per billion (ppb) and 10 parts per million (ppm).

In one embodiment, the method may include a pre-treatment prior to treating with the treatment solution. The pre-treatment may include, but is not limited to, dilute hydrofluoric acid (DHF) (e.g., 100:1, DiW:HF) that may be heated between 20° C. and 50° C., and that may be used to prepare the polysilicon for etching. This may include removing any oxide that may have grown when the microelectronic substrate was exposed to ambient air conditions outside of the process tool.

Figure 3A:
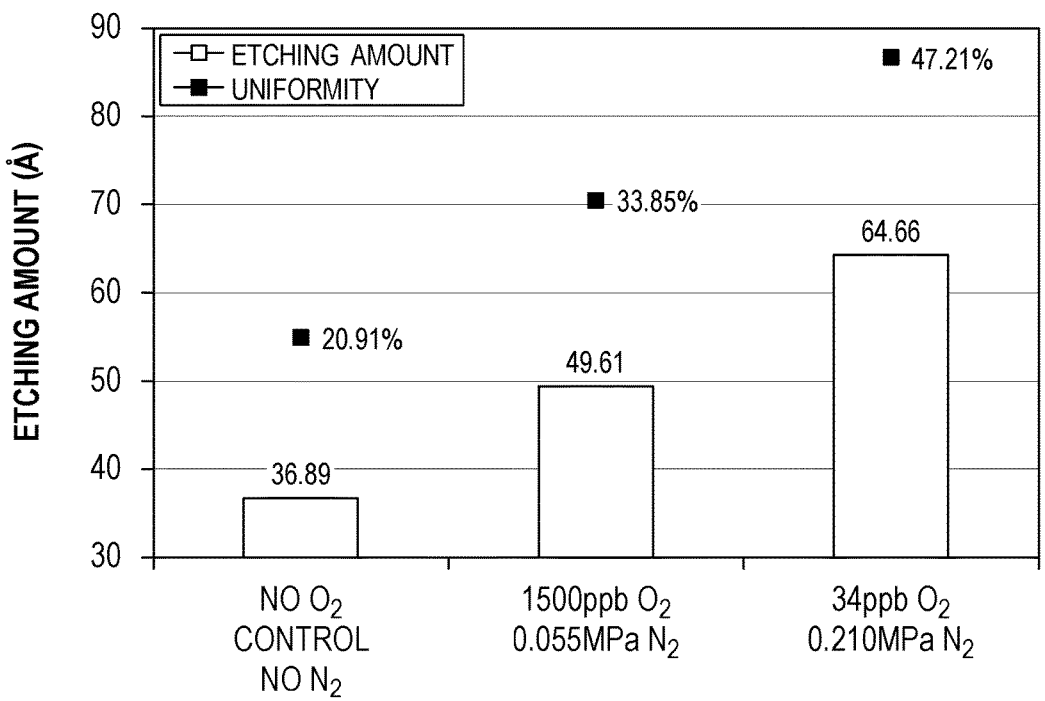
FIGS. 3A and 3B are a bar chart and graph, respectively, illustrating the effect of pressure control with nitrogen gas on the etch rate and etch profile according to embodiments of the invention.
Figure 3B:
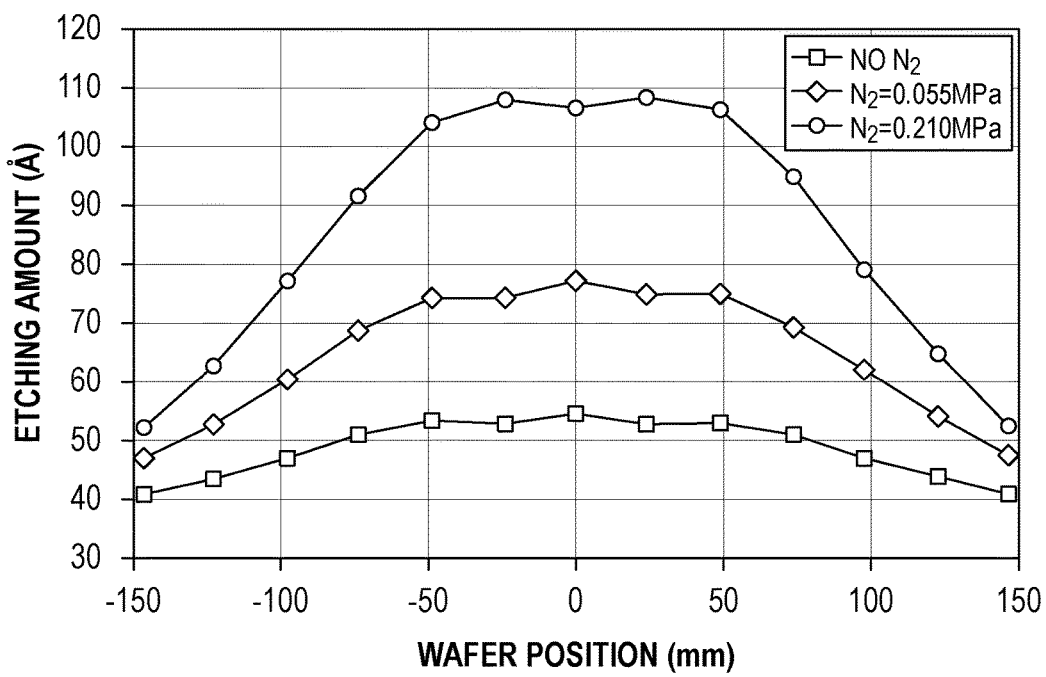

As shown in the chart and graph of FIGS. 3A and 3B, respectively, for a process flow that includes a DHF pre-treatment (100:1) followed by a dilute TMAH (4:1 DiW:TMAH) etching treatment, the etch rate and profile can be tuned by pressuring the TMAH source with $N_2$ gas. A more uniform center-etch profile and slow etch rate is achieved without the $N_2$ gas. A faster etch rate and change in profile to increase the etch rate at the center versus the edge is achieved with the $N_2$ gas. A moderate profile change and increased etch rate is seen with 0.055 MPa $N_2$ gas pressure in the source tank and 1500 ppb oxygen content in the dilute TMAH, while a more drastic change is seen with 0.210 MPa $N_2$ gas pressure in the source tank and 34 ppb oxygen content in the dilute TMAH.

Figure 4:
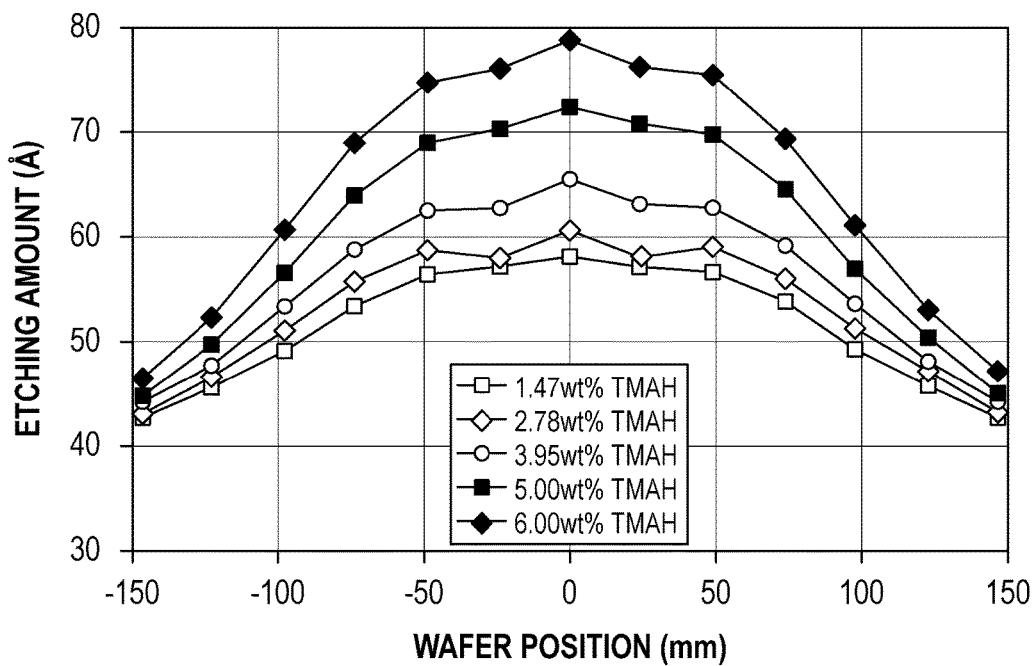
FIG. 4 is a graph illustrating the effect of TMAH concentration on the etch rate and etch profile according to embodiments of the invention.

Similarly, as shown in the graph of FIG. 4, the etch rate and profile can be tuned by adjusting the TMAH concentration in the treatment solution. The etch rate and profile change increase with increasing TMAH concentration. For example, the difference between the center etch rate and the edge etch rate increases with increasing concentration. The TMAH concentration generally may be between 0.1% and 30% by weight of TMAH. For certain embodiments, the treatment solution may contain 20% to 30% by weight of TMAH, while for other embodiments, the treatment solution may contain 0.1% to 5% by weight of TMAH.

Figure 5:
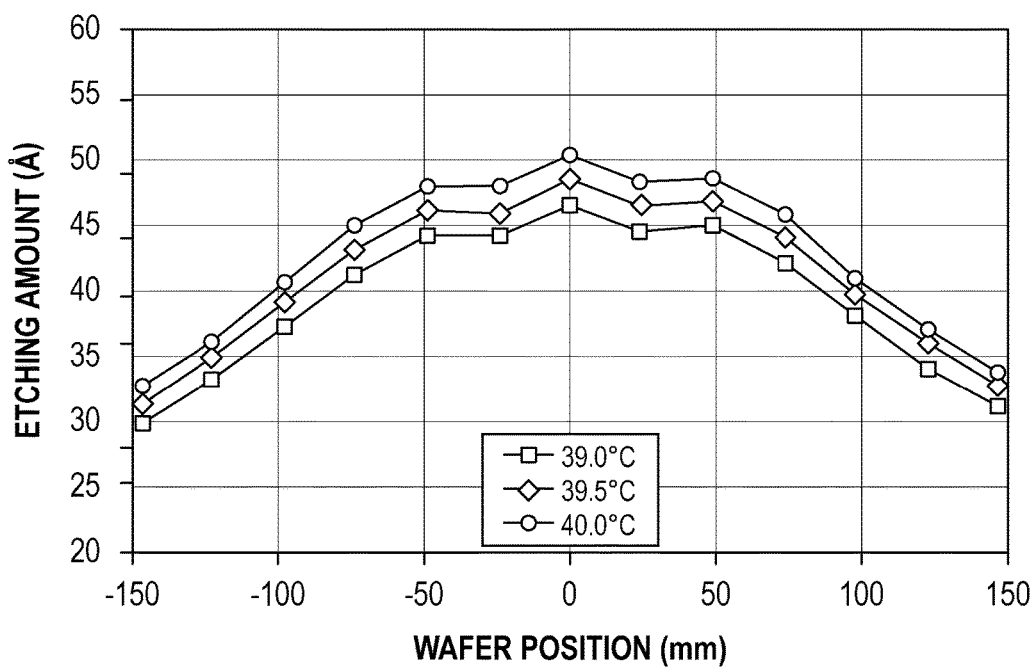
FIG. 5 is a graph illustrating the effect of the temperature of the treatment solution on the etch rate and etch profile according to embodiments of the invention.

The etch rate or profile may also be influenced by the temperature of the treatment solution. Broadly, the process tool may maintain the treatment solution at a temperature between 20° C.-70° C. However, in other specific embodiments, the temperature may be maintained between 20° C. and 50° C., between 20° C. and 30° C., between 30° C. and 40° C., or between 40° C. and 50° C. As shown in the graph of FIG. 5, the amount etched (in Angstroms) increases with temperature, across the substrate. Thus, a faster etch rate can be achieved uniformly across the substrate by increasing the temperature of the treatment solution.

Embodiments may include controlling oxygen content by controlling the oxygen concentration of a gas used to pre-treat the microelectronic substrate, as discussed above, and following the exposure of the gas, a treatment solution may be applied to the microelectronic substrate that also has a controlled oxygen content. In one instance, the treatment solution may include a mixture of a dilution solution and TMAH that includes an oxygen concentration of less than 10 ppm or less than 1%. In other specific embodiments, the oxygen concentration may be less than 5 ppm, less than 100 ppb, or less than 1500 ppb. The dilution solution may include, but is not limited to, water or deionized water. Ozone or hydrogen peroxide may also be added, as discussed above. Prior to dispensing into the process chamber, and as discussed above, the temperature of the treatment solution may also be controlled to help achieve the desired etch rates or etch profiles. Broadly, the process tool may maintain the treatment solution at a temperature between 20° C.-70° C. However, in other specific embodiments, the temperature may be maintained between 20° C. and 50° C., between 20° C. and 30° C., between 30° C. and 40° C., or between 40° C. and 50° C.

One approach to selecting the process conditions from the methods disclosed herein may be to optimize the etch rates or etch profiles using a feedback method to tune or control the process results on the microelectronic substrate. For example, this may include exposing an initial microelectronic substrate to an initial treatment solution and an initial gas, the initial treatment solution comprising a dilute TMAH solution, and the gas comprising an oxygen concentration being less than 30% by weight of the gas, for example less than 20%, or less than 10%, or less than 5%, or between 1 ppb and 10 ppm. Following the initial treatment, a measurement of one or more features of the microelectronic substrate may be done to determine the etch rate or etch profile. Broadly, the thickness or profile of the etched layer, feature or structure of silicon may be measured. More specifically, the measured features may include, but are not limited to, a film layer thickness profile, a film layer thickness, a patterned structure profile, or any combination thereof. Based at least in part on the measurement, a person of ordinary skill in the art may adjust one or more characteristics of the initial treatment solution or the initial gas. For example, the etch profile may be a center high profile that may be lowered. Likewise, there may be an edge high profile that may be lowered or an edge low profile that may be raised. Also, the etch rate may be lowered or raised depending on the measurement results.

The one or more characteristics of the treatment solution that may be adjusted based on the measurement may comprise temperature, oxygen concentration, nitrogen concentration, pressure, or any combination thereof. The one or more characteristics of the gas that may be varied may include temperature, oxygen concentration, nitrogen concentration, pressure, or any combination thereof. In other embodiments, the adjustments may include varying the oxygen concentration of the gas and the treatment solution or changing the oxygen concentration of the gas or the treatment solution, separately, based on the knowledge of a person of ordinary skill in the art. The adjustments may be done in view of the process condition ranges described above.

Following the adjustment, a subsequent microelectronic substrate may be exposed to the new treatment solution or gas concentration determined during the adjustment analysis described above. This process may be iterated until the desired etch rate or etch profile is achieved.

In certain instances, removal efficiency may vary with the geometry of the patterned features on the microelectronic substrate. For example, removal efficiency may decrease with increasing aspect ratio of the patterned features (i.e., ratio of depth to width of the feature). Generally, a person of ordinary skill in the art may optimize the process conditions to achieve a desirable removal efficiency. For example, varying the dilution solution used with the TMAH may also increase removal efficiency and/or achieve desirable features on the microelectronic substrate.

In one embodiment, the treatment solution may include a mixture of a dilution solution and TMAH that may be used to treat the microelectronic substrate. More specifically, the dilution solution may be a liquid that is mixed with the TMAH, for example in the source tank of the liquid dispensing system, and dispensed together onto the microelectronic substrate. However, in other embodiments, the dilution solution and the TMAH may be dispensed separately, such that the treatment solution is formed in the process chamber, at or above the substrate. The dilution solution may include, but is not limited to, water, deionized water, hydrogen peroxide, ozone, or any combination thereof. The addition of hydrogen peroxide or ozone may be used in particular with higher aspect ratio features. In yet another embodiment, one dilution solution may be mixed with the TMAH in the tank, for example water or deionized water, while another dilution solution is dispensed separately, for example hydrogen peroxide or ozone. Prior to dispensing in the process chamber, the process tool may maintain the treatment solution at a temperature between 20° C.-70° C. However, in other specific embodiments, the temperature may be maintained between 20° C. and 50° C., between 20° C. and 30° C., between 30° C. and 40° C., or between 40° C. and 50° C. The ratio between the dilution solution and the TMAH may vary depending on the application. Several different applications may include, but are not limited to between 0.1% and 30% by weight of TMAH, 20% and 30% by weight of TMAH, and 0.1% and 5% by weight of TMAH.

As discussed above, and by way of example and not limitation, the microelectronic substrate may include a polysilicon film, which may be patterned to include a hole or trench or may be part of a patterned film stack; may comprise a copper film, such as a Through-Silicon-Via (TSV) that includes a copper interconnect feature or a bonding structure; or may include logic or memory structures, such as a 3DNAND structure.

Figure 6A:
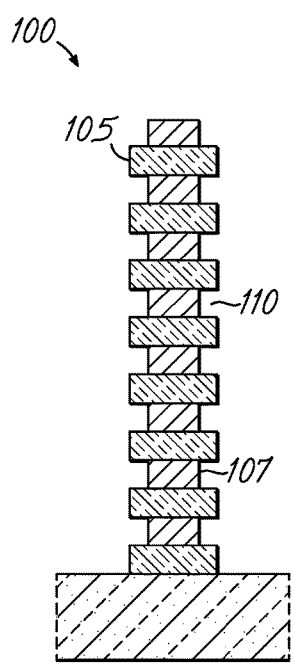
FIGS. 6A-6C are schematic cross-sections illustrating poly deposition and etch of a 3DNAND device.
Figure 6B:
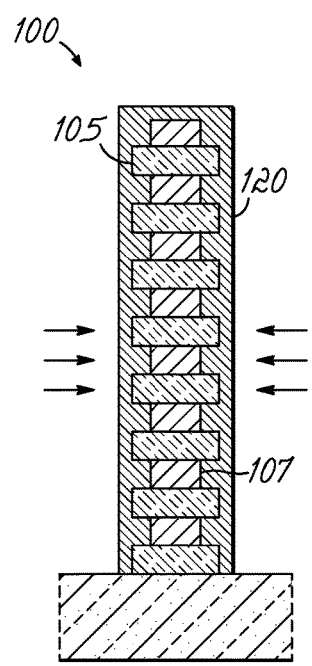
Figure 6C:
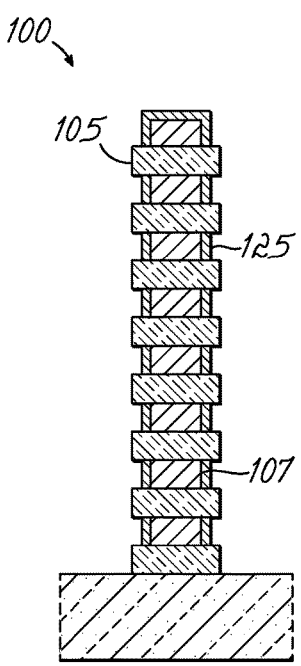

In one specific embodiment, the patterned feature on the microelectronic substrate may include a memory device (e.g., 3DNAND) as shown in schematic cross-section in FIGS. 6A-6C. The memory device 100 may include alternating layers of silicon oxide 105 and conductive polysilicon 107, or other conductive material such as silicon nitride. A plurality of trenches (not shown) are formed from the top to bottom of the stack of alternating layers. FIGS. 6A-6C depict the portion of the stack that resides between two trenches. A pattern of pockets 110 are formed in the trenches by recessing the conductive polysilicon 107 relative to the silicon oxide layers 105. The aspect ratio of the memory device 100 is defined by the ratio of a longitudinal dimension to a lateral dimension. The longitudinal dimension is the trench depth, i.e., the distance from the top of the stack to the bottom of the stack. The lateral dimension of the device is the width of the trench opening, defined between the perimeter or edge of circumference of the patterned feature and an adjacent patterned feature. In one instance, the longitudinal dimension may include a trench depth of up to 1000 nm and the lateral dimension may include a trench opening of up to 100 nm, and the aspect ratio may be up to 10:1. In other embodiments, the aspect ratio may include ratios of 40:1 or greater, such that the difference between the lateral dimension and the longitudinal dimension may increase. For example, the trench depth may range up to 2000 nm and the trench opening may range up to 50 nm. In one embodiment, the trench depth is between 1000 nm and 2000 nm and the trench opening is between 50 nm and 100 nm.

In FIG. 6B, a layer of polysilicon 120 is deposited into the trenches, filling the pockets 110 and covering the patterned features (e.g., poly deposition). In FIG. 6C, a subsequent etching process, shown by the arrows, selectively removes a portion of the deposited polysilicon 120 relative to the oxide layers 105 that were covered by the poly deposition. The aforementioned TMAH processes disclosed herein may enable the selective polysilicon removal, for example, to recess the polysilicon into the pockets 110, leaving a thin polysilicon layer 125 between the oxide layers 105 as shown. As aspect ratios of 3DNAND devices increase from 10:1 to 40:1 or greater, center to edge and top to bottom stack uniformity of the remaining polysilicon thickness in the pockets will be critical for device performance. Thus, the method of controlling oxygen content in the dilute TMAH etching process of the polysilicon described herein may be used to achieve the necessary etch selectivity and uniformity for 3DNAND devices.

Figure 7A:
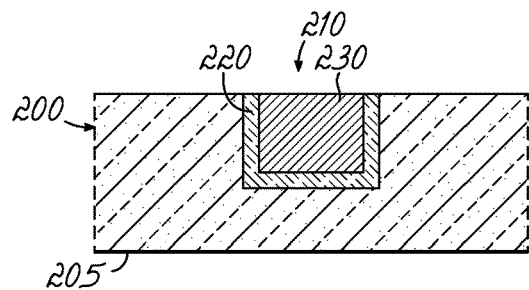
FIGS. 7A-7D are schematic cross-sections illustrating formation of a TSV device.
Figure 7B:
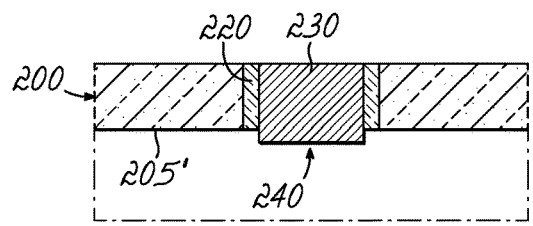
Figure 7C:
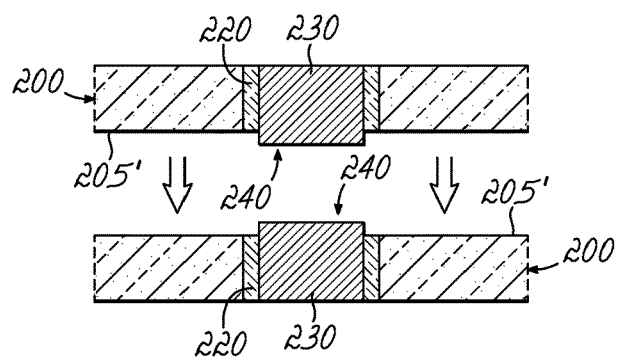
Figure 7D:
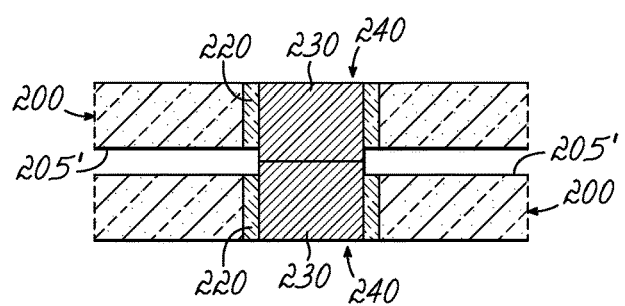

In another embodiment, the patterned feature may include a TSV feature as illustrated in schematic cross-section in FIGS. 7A-7D. FIG. 7A depicts a silicon wafer 200 having a via 210, lined with an insulating liner 220 and filled with a copper interconnect feature 230. In FIG. 7B, the backside 205 of the silicon wafer 200 is polished and etched by a controlled silicon etch to expose the copper interconnect feature 230, which forms the TSV feature 240. Two silicon wafers 200 each with exposed TSV features 240 can then be stacked and bonded as shown in FIGS. 7C and 7D by placing the etched backsides 205' together with the TSV features aligned. Across-wafer uniformity for the silicon etch is critical for the TSV stack. The method of controlling oxygen content in the dilute TMAH etching process of the polysilicon described herein may be used to achieve the necessary etch uniformity for TSV devices. The TSV aspect ratio is the ratio of the depth of the via 210 into the silicon wafer 200 to the feature opening size (via diameter). Broadly, the TSV aspect ratio may range from 3:1 to 20:1 in most embodiments, but may be particularly about 16:1 in one specific embodiment. In other embodiments, the TSV depth may range from 150 μm to 200 μm, but may be particularly about ~160 μm in one specific embodiment. Likewise, the TSV opening may range between 8 μm to 60 μm, but may be about 10 μm in one particular embodiment.

It should be understood that the foregoing description is only illustrative of the invention. Various alternatives and modifications can be devised by those skilled in the art without departing from the invention. Accordingly, the present invention is intended to embrace all such alternatives, modifications and variances that fall within the scope of the appended claims.

What is claimed is:

1. A method for treating a microelectronic substrate, comprising:
    receiving a microelectronic substrate into a process chamber, the microelectronic substrate comprising a layer, feature or structure of polysilicon;
    applying a treatment solution to the microelectronic substrate to etch the polysilicon, the treatment solution comprising a dilution solution and tetramethylammonium hydroxide (TMAH), wherein the dilution solution comprises water or deionized water and further comprises an addition of hydrogen peroxide or ozone to provide a controlled oxygen content in the treatment solution; and providing the controlled oxygen content in the treatment solution and optionally in an environment in the process chamber prior to or during applying the treatment solution to achieve a target etch selectivity of the polysilicon, or a target etch uniformity across the layer, feature or structure of polysilicon, or both by the treatment solution.

2. The method of claim 1, further comprising maintaining the treatment solution at a temperature between 20° C. and 70° C.

3. The method of claim 1, wherein the dilution solution comprises a concentration of less than 1% by weight of the hydrogen peroxide or ozone.

4. The method of claim 1, wherein the dilution solution comprises a concentration between 0.3% and 0.0001% by weight of the hydrogen peroxide or ozone.

5. The method of claim 1, wherein the dilution solution comprises a concentration between 1 part per billion and 10 parts per million of the hydrogen peroxide or ozone.

6. The method of claim 1, wherein the treatment solution comprises between 20% and 30% by weight of TMAH.

7. The method of claim 1, wherein the treatment solution comprises between 0.1% and 5% by weight of TMAH.

8. The method of claim 1, wherein the layer, feature or structure of polysilicon comprises a 3DNAND structure or pattern.

9. The method of claim 8 wherein the 3DNAND structure or pattern comprises a longitudinal dimension to lateral dimension aspect ratio of 10:1 or greater.

10. The method of claim 9, wherein the lateral dimension is between 50 nm and 100 nm and the longitudinal dimension is between 1000 nm and 2000 nm.

11. The method of claim 1, wherein the layer, feature or structure of polysilicon comprises a copper via structure or pattern formed therein.

12. The method of claim 11, wherein the copper via structure or pattern is a Through-Silicon-Via feature comprising an aspect ratio of 10:1 or greater.

13. The method of claim 1, wherein the layer, feature or structure of polysilicon comprises a microbump structure or pattern.

14. The method of claim 1, further comprising exposing the treatment solution to a carrier gas comprising an oxygen concentration of less than 20%, prior to applying the treatment solution to the microelectronic substrate to provide the controlled oxygen content in the treatment solution.

15. The method of claim 1, further comprising exposing the substrate to a pre-treatment solution containing hydrofluoric acid, prior to applying the treatment solution to the microelectronic substrate.

16. The method of claim 1 wherein the treatment solution is a mixture of the dilution solution and TMAH, the mixture comprising an oxygen concentration of less than 1% by weight.

17. The method of claim 16, wherein the dilution solution comprises at least one of water or deionized water, and at least one of hydrogen peroxide or ozone.

18. The method of claim 16, wherein the mixture comprises an oxygen concentration less than 1500 part per billion.

19. A method for treating a microelectronic substrate, comprising:

receiving a microelectronic substrate into a process chamber, the microelectronic substrate comprising a layer, feature or structure of polysilicon;

applying a treatment solution to the microelectronic substrate to etch the polysilicon, the treatment solution comprising a dilution solution and tetramethylammonium hydroxide (TMAH); and providing a controlled oxygen content in the treatment solution or in an environment in the process chamber to achieve a target etch selectivity of the polysilicon, or a target etch uniformity across the layer, feature or structure of polysilicon, or both by the treatment solution, the method further comprising exposing the microelectronic substrate to a gas comprising an oxygen concentration of less than 20% by weight during applying the treatment solution to the microelectronic substrate to provide the controlled oxygen content in the environment in the process chamber.

20. The method of claim 19, wherein the gas is a nitrogen-containing gas comprising a greater amount by weight of nitrogen than oxygen.

21. The method of claim 19, wherein the gas comprises an oxygen concentration less than 5% by weight.

22. The method of claim 19, wherein the gas comprises an oxygen concentration between 1 part per billion and 10 parts per million.

23. The method of claim 19, further comprising, after exposing the microelectronic substrate to the treatment solution and the gas and prior to providing a subsequent microelectronic substrate for exposing to the treatment solution and gas, measuring a thickness or profile of the etched layer, feature or structure of polysilicon and adjusting the controlled oxygen content, temperature of the treatment solution, a nitrogen concentration relative to the oxygen concentration in the gas or treatment solution, or pressure of the gas or treatment solution, or any combination thereof, for the exposing of the subsequent microelectronic substrate to the treatment solution and gas.

24. A method for treating a microelectronic substrate, comprising:

receiving a microelectronic substrate into a process chamber, the microelectronic substrate comprising a layer, feature or structure of polysilicon;

applying a treatment solution to the microelectronic substrate to etch the polysilicon, the treatment solution comprising a mixture of a dilution solution and tetramethylammonium hydroxide (TMAH) and having a first oxygen concentration of less than 1% by weight;

prior to or during applying the treatment solution, exposing the treatment solution or an environment in the process chamber to a nitrogen-containing gas comprising a second oxygen concentration of less than 20% by weight and a nitrogen concentration of the nitrogen-containing gas greater than the second oxygen concentration, wherein the first and second oxygen concentrations are controlled to achieve a target etch selectivity of the polysilicon, or a target etch uniformity across the layer, feature or structure of polysilicon, or both by the treatment solution.

25. The method of claim 24, wherein the dilution solution comprises at least one of water or deionized water, and at least one of hydrogen peroxide or ozone.

26. The method of claim 25, wherein the dilution solution comprises a concentration between 0.3% and 0.0001% by weight of the hydrogen peroxide or ozone.

27. The method of claim 25, wherein the layer, feature or structure of polysilicon comprises a 3DNAND structure or pattern having a longitudinal dimension to lateral dimension aspect ratio of 10:1 or greater.

28. The method of claim 24, wherein the treatment solution comprises the first oxygen concentration less than 1500 part per billion and the nitrogen-containing gas comprises the second oxygen concentration less than 5% by weight.

29. The method of claim 24, further comprising, after exposing the microelectronic substrate to the treatment solution and the nitrogen-containing gas and prior to providing a subsequent microelectronic substrate for exposing to the treatment solution and nitrogen-containing gas, measuring a thickness or profile of the etched layer, feature or structure of polysilicon and adjusting one or more of the first oxygen concentration, the second oxygen concentration, temperature of the treatment solution, the nitrogen concentration, or pressure of the nitrogen-containing gas or treatment solution, or any combination thereof, for the exposing of the subsequent microelectronic substrate to the treatment solution and gas.

* * * * *